United States Patent [19]

Peterson et al.

[11] Patent Number: 4,815,601
[45] Date of Patent: Mar. 28, 1989

[54] CARRIER FOR FLAT PANEL DISPLAYS

[75] Inventors: Michael D. Peterson, Chaska; Robert J. Nentl, Lakeville, both of Minn.

[73] Assignee: Fluoroware, Inc., Chaska, Minn.

[21] Appl. No.: 102,166

[22] Filed: Sep. 29, 1987

[51] Int. Cl.⁴ .............................................. B65D 85/48
[52] U.S. Cl. ...................................... 206/454; 211/41
[58] Field of Search ............... 206/449, 454, 455, 456; 211/41

[56] References Cited

U.S. PATENT DOCUMENTS

| | | | |
|---|---|---|---|
| D. 221,688 | 8/1971 | Elsfelder | D55/1 |
| 1,764,754 | 6/1930 | Scott . | |
| 1,885,691 | 11/1932 | Dressler . | |
| 2,019,722 | 11/1935 | Neumeyer | 224/48 |
| 2,156,955 | 5/1939 | Page | 129/16 |
| 2,194,828 | 3/1940 | Greaves | 312/92 |
| 2,407,021 | 9/1946 | Langel | 220/23.2 |
| 2,453,030 | 11/1948 | Newman | 211/49 |
| 2,729,375 | 1/1956 | Pace | 226/14 |
| 2,774,472 | 12/1956 | Badalich | 206/62 |
| 2,813,633 | 11/1957 | Welling | 211/41 |
| 3,160,283 | 12/1964 | LaChance | 211/184 |
| 3,365,070 | 1/1968 | Miles | 211/126 |
| 3,394,819 | 7/1968 | Saville | 211/126 |
| 3,442,395 | 5/1969 | Taylor | 211/41 |
| 3,467,242 | 9/1969 | DeRousse | 206/1 |
| 3,473,670 | 10/1969 | Elftmann | 211/41 |
| 3,480,151 | 11/1969 | Schmitt | 211/41 |
| 3,486,631 | 12/1969 | Rodman | 211/41 |
| 3,487,943 | 1/1970 | Haidegger | 211/71 |
| 3,498,597 | 3/1970 | Roberts et al. | 263/49 |
| 3,501,047 | 3/1970 | Raabe | 220/71 |
| 3,534,862 | 10/1970 | Shambelan | 211/11 |
| 3,645,581 | 2/1972 | Lasch, Jr. et al. | 302/2 R |
| 3,701,558 | 10/1972 | Baker | 294/33 |
| 3,737,282 | 6/1973 | Hearn et al. | 432/6 |
| 3,819,076 | 6/1974 | Oehler | 214/512 |
| 3,828,726 | 8/1974 | Dietze et al. | 118/500 |
| 3,850,296 | 11/1974 | Hirata et al. | 206/334 |
| 3,923,156 | 12/1975 | Wallestad | 206/454 |
| 3,923,191 | 12/1975 | Johnson | 220/94 R |
| 3,926,305 | 12/1975 | Wallestad | 206/73 |
| 3,930,684 | 1/1976 | Lasch, Jr. et al. | 302/2 R |
| 3,939,973 | 2/1976 | Wallestad | 206/328 |
| 3,947,236 | 3/1976 | Lasch, Jr. | 432/11 |
| 3,961,877 | 6/1976 | Johnson | 432/253 |
| 4,043,451 | 8/1977 | Johnson | 206/334 |
| 4,450,960 | 5/1984 | Johnson | 206/334 |
| 4,471,716 | 9/1984 | Milliren | 118/500 |
| 4,493,418 | 1/1985 | Johnson | 206/454 |
| 4,508,990 | 2/1985 | Essinger | 313/50 |
| 4,511,599 | 4/1985 | Rustomji | 427/66 |
| 4,520,925 | 6/1985 | Johnson | 206/334 |
| 4,557,381 | 12/1985 | Johnson | 206/444 |
| 4,559,535 | 12/1985 | Watkins | 340/793 |
| 4,570,151 | 2/1986 | Martorano et al. | 340/52 R |
| 4,584,786 | 4/1986 | Georgopulos | 40/448 |
| 4,602,189 | 7/1986 | Panicker | 313/505 |
| 4,613,793 | 9/1986 | Panicker et al. | 315/169.3 |
| 4,696,395 | 9/1987 | Rivoli | 206/449 X |

FOREIGN PATENT DOCUMENTS 1334330 10/1973 United Kingdom .
2041726 9/1980 United Kingdom ............... 206/449

OTHER PUBLICATIONS

Michael L. Osgar Patent Application for Welding Fluoropolymer Pipe and Fittings; Ser. No. 628,784, filed 07/09/84.

(List continued on next page.)

Primary Examiner—William Price
Attorney, Agent, or Firm—Palmatier & Sjoquist

[57] ABSTRACT

A carrier for large glass panels or substrates coated with material being processed into flat panel displays, the carrier including end panels with planar portions offset endways outwardly of the carrier to permit access to the end most panels in the carrier, a multiplicity of sidewall segments spaced from each other and spaced around the periphery of said end wall panels to define three sidewalls of the carrier, leaving one side open for access into the interior of the carrier, the sidewall segments having grooves and ribs for receiving and supporting the edges of the glass panels, the sidewall segments being welded to the end walls in an integral one piece structure, the wall segments having mounting panels at their ends, the mounting panels and the end walls having oblong annular ribs extending along the peripheries of the end walls and being welded together for rigidly attaching the sidewall segments to the end walls in an integral one piece construction.

15 Claims, 3 Drawing Sheets

OTHER PUBLICATIONS

1974 Silicon Technology Corporation, Bulletin 4102 "Production Information STC Wafer Baskets".
Dec. 1985; Emerson Plastronics; "Silicon Wafer Handling System", Spin Dryer for Silicon-Wafers.
Fluoroware 1986 Catalog.
Ind. Modular Systems Corp. 1-1971; "Loader/Unloader and Sender/Receiver", 6100 Series.
IBM Technical Disclosure Bulletin; vol. 8 No. 11, Apr. 1966; "Wafer Package" by L. Hershoff.
IBM Technical Disclosure Bulletin, vol. 14, No. 10 Mar. 1972.
Emerson Plastronics, Inc.; 12/85; "Throw Away Your Tweezers", pp. 1-3.
Indus. Modular Sys. Corp.; 1971; "Wafer Carriers".
Peninsula Electronics; Mar. 1971; "Automated Application of Photoresist Coatings . . . ".
"Engineering Plastics and Their Commercial Development", Adv. In Chemistry Series 96; Am. Chem. Soc.; 1969.
"Engineering Guide to Phenolic Plastics"; Materials Engineering; June 1971.
"How to Avoid Warpage Problems in Injection Molded Parts; Plastics Design and Processing"; Jan. 1974.
"Fluoropolymers Now are Tougher and Easier to Process", Materials Engineering; Aug. 1972.
"Versatile Engineering Thermoplastic Combines Dimensional Stability Resistance to Heat and Water", Materials Engineering 1971.
Plastic Mold Engineering, rev'd ed., DuBois and Pribble Reinhold Publishing Corporation; pp. 71, 76-77. (date unknown)
"Plastics Technology, Basic Materials and Processes", R. S. Swanson; McKnight Publ. Co., 1965; pp. 157-158, 166.
"Engineering Design for Plastics", Ed. by E. Baer; Reinhold Pub. Corp.; 1964; pp. 1155, 1159, 1171-1173.
"Fundamentals of Tool Design"; Am. Soc. of Tool and Manufacturing Engineers, 1962; pp. 299-300.
"Engineering Data for Product Design" Greenwood; McGraw Hill Book Co., Inc. 1961; pp. 2, 20.
"Plastic Engineering Handbook"; Society of the Plastics Industry, Inc. 3d Ed. 1960; Reinhold Pub. Corp. pp. 301-303; 286.
"Dictionary of Terms Parts I and II"; Horner; The Technical Press, London, 8th Ed. 1960; pp. 168, 287.
"Machinery's Handbook", 16th Ed. 1959; pp. 348-410.
"Plastic Engineering Handbook", The Soc. of the Plastics Industry, Inc. Reinhold Pub.; 1954; pp. 421-425.
"Structural Design In Metals", Williams & Harris; McGraw Hill Book Co., Inc., 1948; pp. 96-97.
"Elementary Structural Analysis"; Wilbur & Norris; McGraw-Hill Book Company, Inc. 1948; pp. 14-15.
"The Production of Plastics" Kaye; International Textbook Company; 1947; pp. 317, 330-331.
"An Introduction of Engineering Plastics", Brown & Harris Murray Hill Books, Inc., 1947.
"Applied Plastic Product Design", Davis and Beck; Prentice-Hall, 1946. pp. 48-53.
"Plastics Handbook for Product Engineers" Sasso; McGraw-Hill Book Co., Inc. 1946; pp. 311, 344-345.
"Handbook of Plastics", Simonds & Ellis; Van Nostrand Company, Inc. Aug. 1943; pp. 834, 855.
"Industrial Plastics"; Simonds; Pitman Publishing Corp.; 1939; pp. 286-287; 308-309.
"Hutchinson's Technical Scientific Encyclopedia", Ed. by Tweeney & Shirshov; vol. II; McMillan Co; 1935.
"Plastics design", Plastics World 1972; p. 31.
"Structural Foam in Your Future? It's Closer than You Think!", Plastics World, Apr. 1972; pp. 40-44.
"Sign Savvy Lies Behind Attractive Moldings", Plastics Design May 1971; pp. 27-28.
"Designers: Remember These FRTP Basics", Plastics World, May 1971; pp. 62-63.
"Plastic Design; Ideas From the Design Board", Plastics World; 1973; p. 31.
"Plastic Production Design" Beck; Van Nostrand Reinhold Company; 1970; pp. 18-21; 89-185; 345-361.
"Modern Industrial Plastics" Richardson; Howard W. Sams & Co., Inc. 1974; pp. 116-126.
"Tool Engineers Handbook" 1959; pp. 47-9-47.11.
"Design Guidelines for Injection-Molded FEP Parts", Journal of Teflon; Apr. 1966; vol. 7 No. 3. pp. 1-5.
"How to Avoid Warpage Problems In Injection Molded Parts", 1974 Plastics Design & Processing, pp. 25-27.

CARRIER FOR FLAT PANEL DISPLAYS

BACKGROUND OF THE INVENTION

In the manufacturing of flat panel displays, a panel of glass or other similar material will have numerous layers or coatings deposited thereon and stacked one upon another. The coatings are of widely different natures and act together to produce images which are visible through the glass panel. Certain of the layers of materials deposited on the glass substrate require high heat processing with temperatures in the range of 165° C. to 180° C. being commonly encountered; and other materials are subjected to strong chemicals such as acid in etching processes. The coatings or deposited films are extremely thin, and on the order of 2,000 to 6,500 Angstroms in thickness. The various materials which are deposited on the face of the glass substrate may include metal vapor to provide a high resolution back metal electrode with a thickness of about 1,000 Angstroms; a transparent layer of Indium Tin Oxide with a thickness of approximately 1,700 Angstroms; a transparent dielectric layer, or yttria layer with a thickness of approximately 2,000 Angstroms; a transparent light generating phosphor layer, which may be zinc sulfide doped with manganese, and with a layer of a thickness of about 6,000 Angstroms; a light emission enhancing layer such as tantalum pentoxide with a thickness of approximately 200 Angstroms; a light sink or light absorbing layer of a semiconductor compound and a thickness of about 2,500 Angstroms; and an aluminum electrode layer formed into conductive strips with a thickness of about 1,200 Angstroms; and possibly an amorphous silicon layer, and other miscellaneous electrodes and connectors.

Of course it is important, during the processing and multisteps of handling the glass substrates with the films or coatings deposited thereon, to handle the substrates carefully and in batches so that they may be easily transported from one work station to another and stored between process steps. The weight of the panels is significant because of the number and size of the panels in a batch. Simultaneous processing of 15 or more panels is regularly done.

Flat panel displays, being used as substitutes for cathoderay tubes (CRT) are rather large and may be roughly square or rectangular with sizes 12 to 18 inches at each side, or larger.

Carriers have been known in the past for handling silicon wafers in the manufacture of integrated circuit chips and such carriers are illustrated in numerous patents such as U.S. Pat. Nos. 3,961,877 and 4,471,716. Most such carriers are molded integrally in one piece and of heat resistant and chemical resistant materials such as perfluoroalkoxy otherwise known as Teflon PFA, which is a trademark of E. I. duPont deNemours & Company, Wilmington, Del. Other Teflon materials which are resistant to strong chemicals and heat include Teflon TFE which is not melt processible, but is compressed into a block and then machined to the desired shape. Certain carriers are made of cheaper plastics when not subjected to severe conditions; and there have been a few metal carriers fabricated with the use of screws connecting cast sidewall panels together with rods across the ends of the carriers to retain the sidewalls in predetermined relation to each other. Such metal carriers have been illustrated in U.S. Pat. No. 3,930,684.

SUMMARY OF THE INVENTION

An object of the invention is to provide an improved carrier for plates and panels being processed for use in flat panel displays of a size comparable to the displays of CRT's used in television sets. The carrier is fabricated of a number of components which are molded of fluoropolymer material such as perfluoroalkoxy, oftentimes known as Teflon PFA, and similar materials A feature of the invention is a fabricated panel carrier which is well adapted to be constructed of melt processible plastic and which includes a multiplicity of individual wall segments spaced from each other and extending between and affixed to the carrier end walls. The end walls of the carrier will be normally oriented horizontally at the upper and lower ends of the sidewalls, which are most generally oriented vertically when the carrier is in use. The glass plates or substrates will often be horizontally oriented as they are slipped into and out of the carrier, and lie generally parallel to the end walls of the carrier.

The sidewalls extend around three sides of the interior of the carrier, and the fourth side of the carrier is open. The glass plates or substrates are loaded into and withdrawn from the carrier through the open fourth side. A handle may be fitted onto each of the end walls to accommodate readily carrying the carrier without manually touching any of the glass plates or substrates carried in the carrier. For carrying purposes, the open side of the carrier will be oriented upwardly and the sidewall opposite the open side will serve as the bottom of the carrier during transport.

The wall segments of the carrier are widely spaced from each other and extend entirely between the end walls. The wide spacing between the wall segments, together with the open front side of the carrier accommodates spray processing of the glass plates or substrates being carried, and also accommodate thorough cleaning and rinsing of the plates to remove all of the processing chemicals and other contaminants or particulate material which may be present during certain phases of the processing.

The wall segments, which are individually molded and then affixedly assembled with the end walls, have an elongate undulating panel which defines a multiplicity of confining ribs adjacent grooves which receive the edges of the glass panels therein, and the wall segments also have tubular and rod-like side rails or frame elements which extend entirely throughout the length of the side rail. The tubular side rails extend along the opposite sides of each wall segment to minimize flexing of the wall segment under the influence of the weight of the glass panels and other mechanical stresses that may be employed as during centrifugal processing in rotary machinery.

Each of the wall segments has mounting panels at each end, and each of the mounting panels is arranged in confronting relation with a portion of the end wall. Each of the mounting panels on each wall segment extends along an edge portion of the adjacent end wall.

Each of the mounting panels of each wall segment has an oblong or elliptically shaped annulus or boss protruding toward the adjacent end wall; and similarly, the end wall has an oblong or elliptically shaped annulus or boss protruding from the face of the end wall and toward and into confronting relation with the annulus on the mounting panel of the adjacent wall segment.

In the fabrication of the carrier, the oblong annuli on each of the end walls are butted against the oblong annuli on the wall segments and welds are formed between the butted annuli as to entirely weld each of the annuli around its entire periphery against the annulus against which it is abutted.

The oblong annuli on the mounting plates of the wall segments are oriented as to traverse the widths of the wall segments so that when the carrier has been completed by finishing all of the welds, the carrier obtains strength from all of the wall segments to minimize any likelihood of flexing or changing of the shape of the carrier as by warping or twisting in any direction. The glass panels will be held securely against the possibility of movement of the panels toward one another as they are confined in the grooves between the ribs on the sidewalls.

The completed carrier, though fabricated, has the characteristics of a carrier which is made entirely integrally and in one piece because of the consistency in the welds between the wall segments and end walls produced by the butt welds between the confronting and matching annuli on the wall segments and end walls.

The carrier is readily rinsed and cleaned between the various process steps in which it is used, as to remove all chemicals as by rinsing and as to remove moisture from all of the surfaces of the carrier. The abutting and welded annuli forming the joints between the mounting panels of the wall segments and the end walls present smooth and unencumbered exterior surfaces which may be readily cleaned without any fear of entrapping contaminants or other particulate material or processing chemicals that become contaminants as they may be carried over from one step to another.

The one end wall of the carrier has supporting feet protruding endways from it, and has locator holes in the end wall for fitting and indexing onto automatic machinery.

The tubular side rails in the wall segments may, optionally, contain stiffening inserts of quartz, stainless steel and other stiff materials which will withstand the deteriorating effect of strong chemicals.

DESCRIPTION OF THE DRAWINGS

FIG. 4 is an enlarged detail section view taken along a broken line as illustrated at 4—4 in FIG. 2.

DETAILED SPECIFICATION

Figure 5:
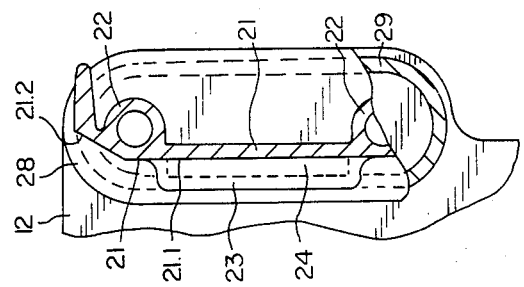
FIG. 5 is an enlarged detail section view taken approximately at 5—5 of FIG. 1.

One form of the invention is illustrated in the drawings and is described herein.

A modified form or optional feature of the invention is also illustrated in dotted lines in FIG. 4.

The carrier is indicated in general by numeral 10 and includes a pair of end walls 11 and 12 and three sidewalls 13, 14 and 15.

End walls 11 and 12 are substantially identical, with minor exceptions hereinafter detailed, and each of the end walls 11 and 12 is formed of a single integral panel formed in one piece.

The sidewalls 13, 14 and 15 are formed of a plurality of individual wall segments 16a, 16b, 16c, 16d, 16e and 16f, all of which are identical with each other except for their particular arrangement in the carrier 10. All of the end walls 11, 12 and all of the wall segments 16a, 16b . . . 16f are molded of melt processible plastic, capable of withstanding substantially high liquid temperatures and capable of withstanding the deteriorating effects of strong chemicals. Such a plastic may be a fluoropolymer plastic, such as Teflon PFA. Each of the end walls 11, 12 and each of the individual wall segments 16a, 16b . . . 16f is molded integrally and in one piece; and the carrier 10 as a whole is fabricated into a one piece carrier as hereinafter detailed.

Figure 2:
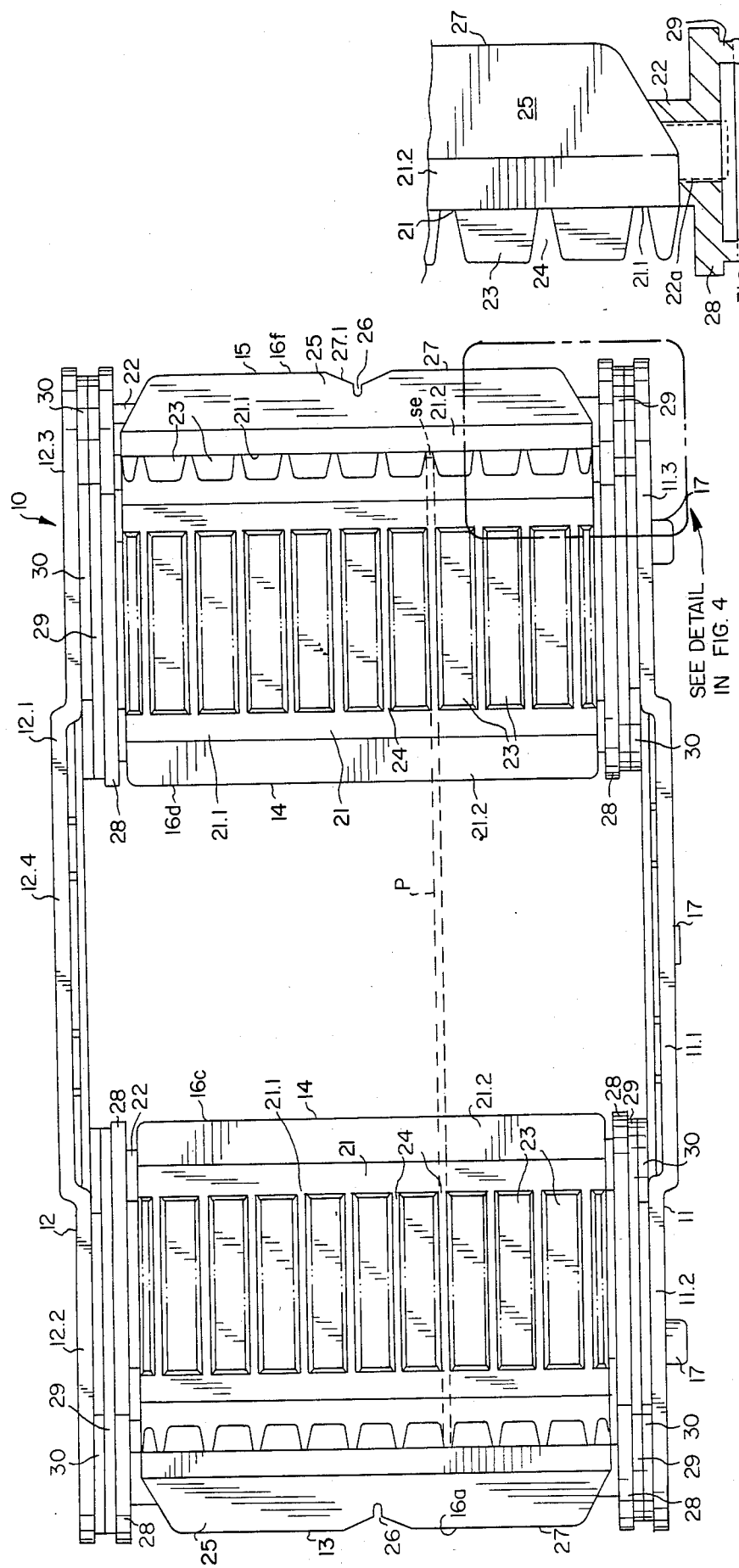
FIG. 2 is a front elevation view of the carrier, looking into the open side, and illustrating in phantom lines, a single glass panel carried therein.
Figure 3:
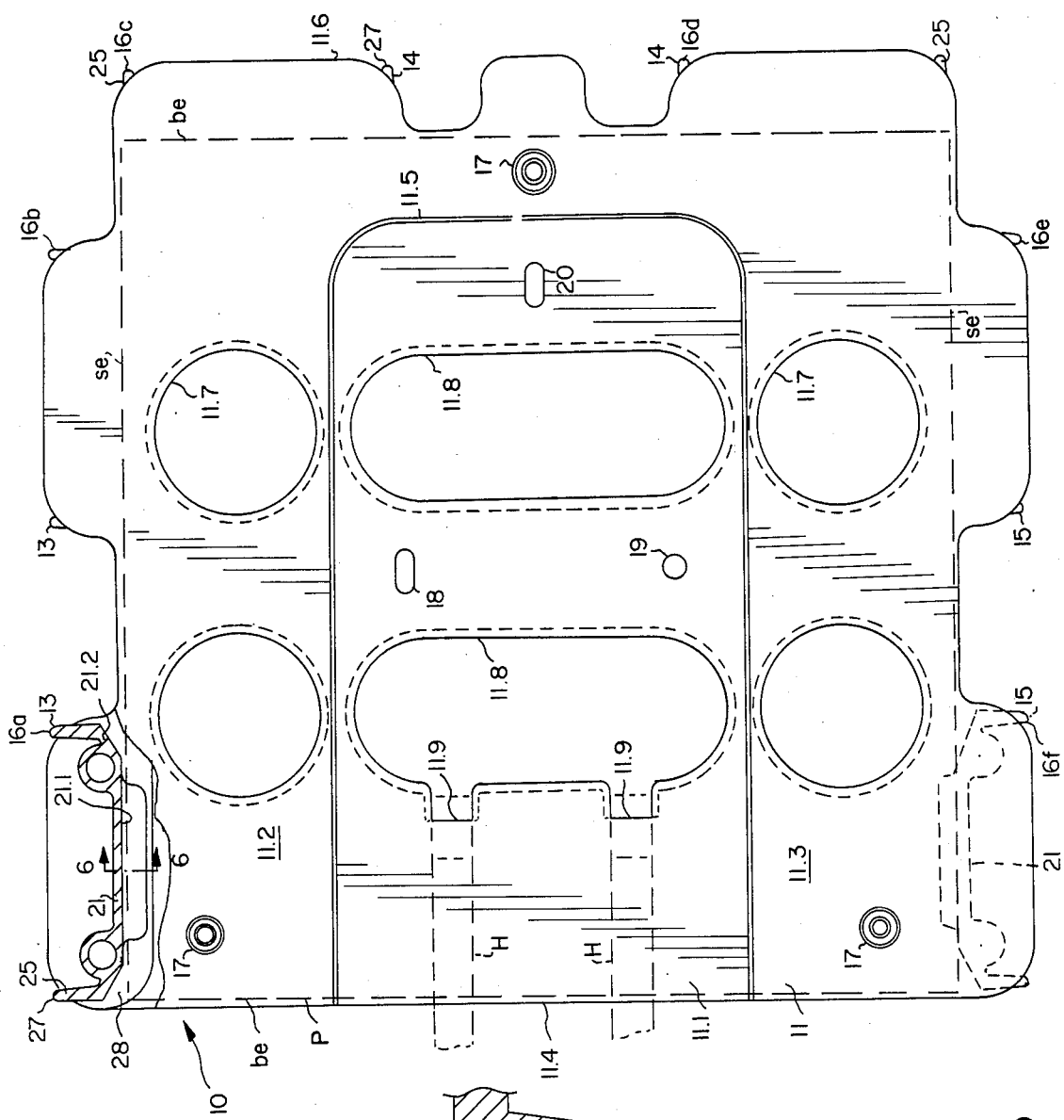
FIG. 3 is a bottom plan view of the carrier, partly broken away for illustration of detail, and showing in dotted lines a portion of a handle structure attached to the carrier.

End wall 11 comprises a panel which is substantially planar, and has a central portion 11.1 which is offset slightly from the side portions 11.2, 11.3 of the end wall. The offset is well illustrated in FIGS. 2 and 3, and it will be noted that the offset panel portion 11.1 extends from the top or front edge 11.4 of the end wall to an oblique or offset portion 11.5 which is spaced from the rear edge 11.6 of the end wall 11.

End wall 11 also has a multiplicity of large circular and oblong openings 11.7 and 11.8 formed therein in order to lighten the end wall without appreciably reducing its strength required to accomplish its functions. The end wall 11 also has rectangular recesses 11.9 formed in the periphery of the forward most of the openings 11.8 to accommodate a handle H which may be attached to the end wall 11 at the recesses 11.9.

Figure 1:
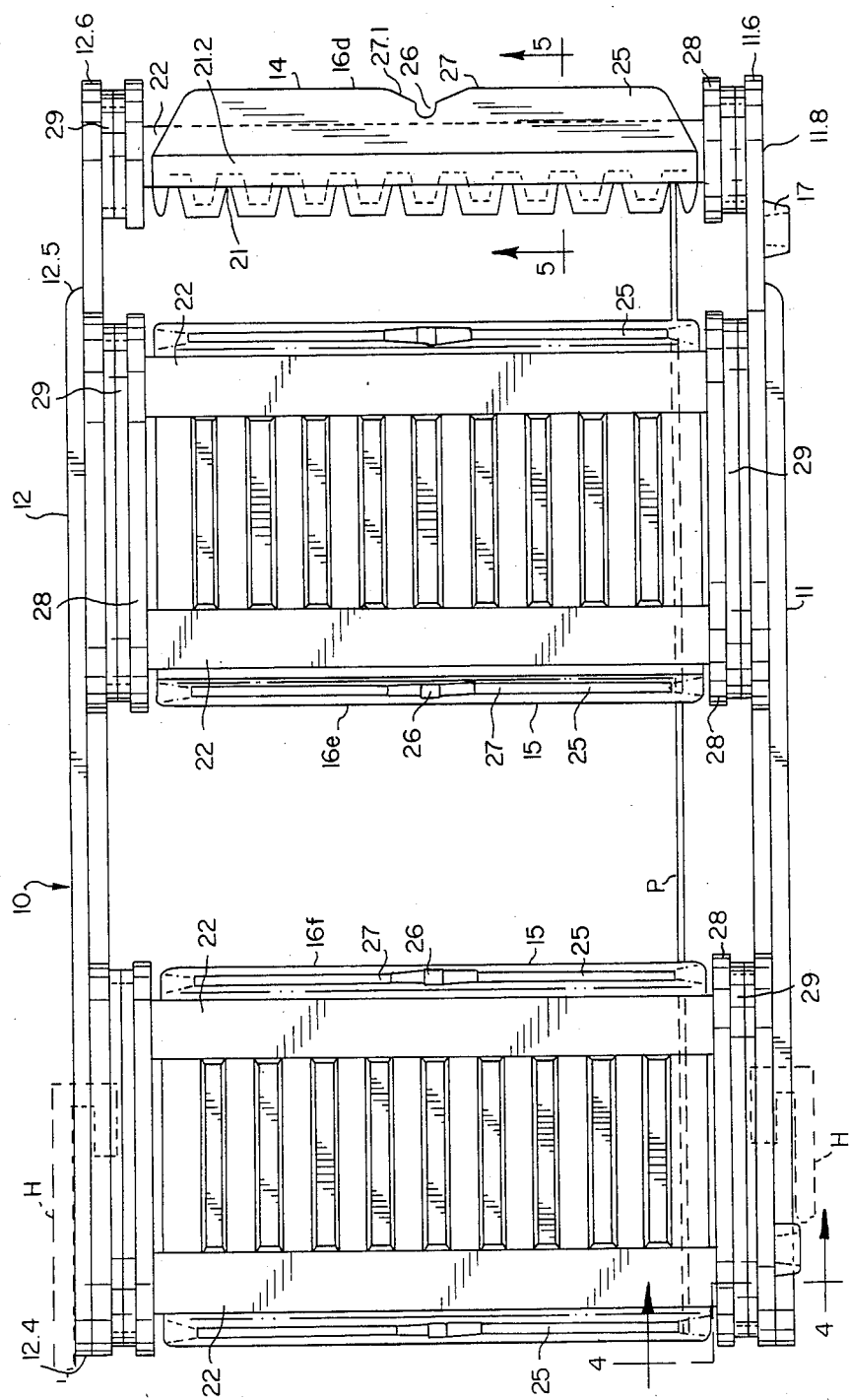
FIG. 1 is a side elevation view of the carrier and illustrating a single glass plate carried therein.

End wall 11 also has a multiplicity of annular bosses 17 formed integrally thereof and protruding from the outer face 11.8 in an outward direction of the carrier 10. All of the bosses 17 protrude from the end wall a prescribed distance and the end faces of all of the bosses 17 lie in a common plane parallel to the end wall 11 as to support the end wall and the carrier on a flat surface when the carrier is oriented in the position illustrated in FIGS. 1 and 2. The bosses serve to locate the carrier in a prescribed position relative to such a supporting surface and thereby perform an indexing function and locate the glass panels contained in the carrier at predetermined locations so that the panels may be mechanically manipulated as for sliding the panels into and out of the carrier.

End wall 11 also has a plurality of index apertures or openings 18, 19 and 20. It will be recognized that apertures 18 and 20 are oblong, and that the indexing aperture 19 is circular, all for the purpose of properly locating the carrier 10 in relation to certain critical mechanisms in a machine for handling or processing the glass panels. Aperture 20 is located on a center line located midway between the sidewall segments in the sidewalls 13 and 15 so as to be located midway between the side edges se of the glass panels P carried in the carrier. The center lines of the apertures 18 and 19 are located on a center line of the plate midway between the wall segments 16c, 16d and the open front of the carrier to accomplish locating the front and back edges be of the panel relative to an indexing medium utilizing the center line apertures 18, 19.

Accordingly, the openings 18, 19 and 20 perform an indexing function for locating the carrier in automatic machinery used for loading and unloading glass panels into and out of the carrier during processing of the glass panels from which flat panel displays are made.

End wall 12 is substantially identical to end wall 11 with the exception that end wall 12 does not have the bosses 17 nor the indexing openings 18, 19 and 20. The end wall 12 is well illustrated in FIGS. 1 and 2 and has a central panel portion 12.1 which is offset out of the plane of the remainder of the end wall and is offset outwardly of the carrier with respect to the side panel portions 12.2, 12.3. The central offset panel 12.1 is shaped identically to the offset panel portion 11.1 in in the end wall 11, and the offset panel portion 12.1 extends entirely to the front edge 12.4, but the other end 12.5 of the offset panel portion is spaced from the opposite edge 12.6 of the end wall 12.

It should be recognized that the end edges 11.6, 12.6 of the end walls 11, 12 serve as supporting feet for the carrier when the carrier is oriented with the open side facing upwardly.

All of the wall segments 16a, 16b . . . 16f are identical, and an understanding of one such wall segment obtains an understanding of all of them.

Each of the wall segments 16a–16f includes an elongate panel 21 extending throughout the entire length of the wall segment, a pair of tubular rod-like side rails or frame rods 22 which are spaced from each other and located adjacent the sides of the panel 21. The side rails 22 extend throughout the full length of the wall section.

Figure 6:
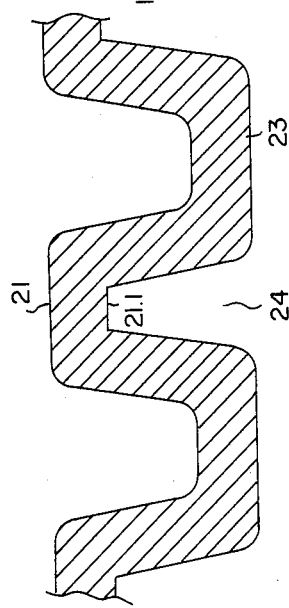
FIG. 6 is a greatly enlarged detail section view taken at 6—6 of FIG. 3.

Each of the wall segments also include the multiplicity of spacer ribs 23 formed by the undulating shape of the panel 21, as illustrated in FIG. 6. The multiplicity of spacer ribs 23 also define a multiplicity of glass panel receiving grooves 24.

Each of the wall segments 16a–16f also includes a pair of outwardly protruding flanges 25 at the sides of the wall segment and formed integrally of the side rails 22 and of the panel 21. The flanges 25 extend throughout the entire length of each wall segment and protrude substantially perpendicularly to the panel 21. Each of the flanges 25 has a notch 26 formed in its outer edge 27 and intermediate the ends of the flange. The side edge 27 of the flange 25 is obliquely oriented at 27.1 adjacent the notch 26, as to form a guiding ramp for guiding a detent into the notch 26 which provides an indexing medium for proper placement of the carrier relative to machinery which may manipulate the carrier during processing of the glass panels.

Frame rods 22 are tubular as particularly illustrated in FIGS. 4 and 5 and lie against the outer side of panel 21. The tubular construction of the side rails or frame rods 22 strengthens the frame rods as to minimize the possibility of flexing the sidewall segments 16a–16f. The tubular construction permits the incorporation of more mold material in the wall segment and in the side rails or frame rods without increasing the sectional thickness of the molded plastic. In an alternative form as illustrated in FIG. 4, the tubular side rail or frame rod 22 may be provided with a rigid or stiff core or core rod 22a which is illustrated in dotted lines and which may be optionally inserted into the side rail prior to assembly with the end walls. The insert rod or core 22a may be formed of any of a number of stiffening materials, such as quartz, stainless steel, or other material which is relatively rigid and not subject to the corrosive effects of strong chemicals, such as acids.

The panel 21 of each of the wall segments 16a–16f has a front face or engaging face 21.1 against which the edges of the glass panels in the carrier may bear. The engaging faces 21.1 of the panels also form the bottom of each of the grooves 24 as illustrated in FIG. 6. Each of the panels 21 also has a pair of oblique surface areas 21.2 adjacent its sides and oriented obliquely with respect to the front face 21.1. Oblique faces 21.2 provide a guiding function with respect to glass panels being inserted into the carrier in certain of the wall segments as those wall segments 16a and 16f which are immediately adjacent the open side of the carrier.

In order to form a rigid connection between the end of each of the wall segments 16a–16f, and the two adjacent end walls 11, 12, each of the wall segments 16a–16f is provided with a pair of rigid mounting panels 28 at its opposite ends. The mounting panel 28 is molded integrally and in one piece with the two side rails or frame rods 22. Each of the mounting panels 28 has an oblong or elliptical shape and extends across the entire width of the sidewall segment of which it is a part. As illustrated in FIG. 5, the mounting panel 28 has rounded ends and traverses both side rails or frame rods 22.

Each of the mounting panels 28 has an annular rib or boss protruding from the mounting plate 28. The annular rib 29 is also elongate and oblong or elliptical in shape and extends around the entire periphery of the mounting plate 28.

The end walls 11 and 12 have a multiplicity of annular ribs or bosses of elongate oblong or elliptical shape. The bosses 30 are molded integrally with the end walls 11, 12 and are of identical shape as the annular ribs or bosses 29 on the mounting plates 28. The annular ribs or bosses 29, 30 are oriented in confronting relation with each other, and each of the confronting bosses 29, 30 are welded together in a butt joint as indicated at 31 in FIG. 4. The welding of the annular bosses is accomplished in a manner known to persons of skill in the art, as by applying radiant heat to the ends of the bosses until they are visibly molten and then moving the molten end faces of the bosses into contacting relation with each other without need for pressure.

The elongate bosses and welded butt joints between the end walls 11, 12, and the wall segments 16a–16f, all extend along the peripheral edges of the end walls so that the oblong orientation of each of the mounting panels 28 is extending along one of the elongate peripheral edges of the end panels. The panels 21 of each of the wall segments is similarly oriented parallel to the adjacent side edge of the end walls.

The elongate welded connections between all of the wall segments and the two end walls result in an integral carrier 10 of one piece with all of the parts thereof being integral with each other in the same fashion as if the carrier were integrally molded rather than fabricated. The annular ribs or bosses 29, 30 and the butt joint welds 31 present a smooth and unencumbered peripheral surface which is devoid of openings or traps in which contaminants or other particulate material may be confined. At each of the butt joint welds 31, a very slight bead is formed, but the bead is very smoothly rounded and will not provide any facility to enclose any contaminants or particulate material.

It is contemplated that the carrier 10 is useful in all different types of wet processing of large glass panels including the processing in liquid baths and also in processing by sprays and centrifugal processing. It should be recognized that the sidewalls 13, 14 and 15 of the carrier all incorporate two separate sidewall segments, and depending upon the size of the glass plates being handled, the sidewalls may incorporate three or more sidewall segments. The sidewall segments are well spaced apart to accommodate thorough cleaning, rinsing and spraying of the glass panels, while at the same time reducing the weight of the carrier to reasonable levels. It should be recognized that it is contemplated that the carrier 10 may be set up as to be adapted for handling glass plates of various sizes, such as plates in the range of 300 mm (11.8 inches) square to 450 mm (17.7 inches) square and larger.

To accommodate glass plates which are approximately 300 mm at each side edge, a carrier with an overall dimension of 13.18 inches from the open side to the opposite edge and a width of 14.22 inches across the two closed sides and a height of 7.83 inches will accommodate such glass plates and provide slots for ten separate plates.

What is claimed is:

1. A carrier for flat glass panels and the like being processed for use in flat panel displays, comprising
   a pair of end walls of melt processible plastic and in confronting and spaced relation to each other,
   and glass panel supporting and spacing means mounted on said end walls and including an elongate sidewall segment of melt processible plastic and extending between and to the end walls adjacent the peripheries thereof to confine and support such glass panels, said sidewall segment having an integrally formed elongate side rail with annular end portions extending endways to and affixed to both end walls.

2. A carrier according to claim 1 and said end walls having panel portions traversing and enclosing the annular end portions of said side rails.

3. A carrier according to claim 2 and the panel portions of the end walls having annuli protruding therefrom and welded to the annular end portions of the side rail.

4. A carrier according to claim 1 wherein said support rail has a substantially tubular portion between said annular end portions.

5. A fabricated carrier for flat glass panels and other substrates of the type for use in flat panels displays, comprising
   a pair of end walls of melt processible plastic and in confronting and spaced relation to each other, and
   a multiplicity of elongate sidewall segments of melt processible plastic extending between and to the adjacent end walls, the sidewall segments having means for engaging and retaining such glass panels, each of the sidewall segments having opposite ends with mounting panels thereon and oriented transversely of the wall segment, and each of the mounting panels confronting and being welded to the adjacent end wall.

6. A fabricated carrier according to claim 5 wherein each of the end walls has elongate peripheral edge portions, said wall segments having widths extending along said peripheral edge portions of the end walls.

7. A fabricated carrier according to claim 6 wherein the mounting panels are elongate and each of the panels extends across the width of the wall segment and along a peripheral edge portion of the adjacent end wall.

8. A fabricated carrier according to claim 5 wherein the end walls and the mounting panels have aligned annuli protruding toward each other and butt welded together.

9. A fabricated carrier according to claim 8 wherein the end walls have elongate peripheral edge portions, said annuli being oblong and the elongate oblong shape extending along said peripheral edge portions.

10. A fabricated carrier according to claim 5 and each of said sidewall segments having a pair of elongate tubular side rails formed integrally thereof and in spaced relation with each other, each of said side rails extending to and being connected with said mounting panels.

11. A carrier according to claim 4 wherein said tubular portion of the side rail is smaller than said annular end portion.

12. A carrier according to claim 1 wherein said end walls have peripheral edge portions, said annular end portions of the side rail having elongate oblong shapes oriented to lie along the peripheral edge portions of the end walls.

13. A carrier according to claim 12 wherein the sidewall segment has a width greater than thickness, the width of the segment being oriented similarly to the length of the elongate oblong shape of the annular end portions.

14. A carrier according to claim 1 wherein each of said end walls has edge portions disposed opposite each other, and said supporting and spacing means including a pair of sidewall segments substantially identical to each other and in spaced and confronting relation to each another, said sidewall segments being respectively disposed adjacent opposite edge portions of the end walls.

15. A carrier according to claim 1 wherein the end walls and said sidewall segments are smoothly shaped to readily shed liquids.

* * * * *